United States Patent [19]

Whiteley

[11] Patent Number: 5,099,238
[45] Date of Patent: Mar. 24, 1992

[54] PARALLEL ANALOG TO DIGITAL CONVERTER

[75] Inventor: Stephen R. Whiteley, Shrub Oak, N.Y.

[73] Assignee: Hypres Incorporated, Elmsford, N.Y.

[21] Appl. No.: 439,061

[22] Filed: Nov. 17, 1989

[51] Int. Cl.[5] .................... H03M 1/00; H03M 7/20; H03M 1/12

[52] U.S. Cl. .................... 341/133; 341/102; 341/156; 341/171

[58] Field of Search .............. 341/122, 123, 124, 125, 341/133, 171, 161, 162, 156, 102

[56] References Cited

U.S. PATENT DOCUMENTS

| | | | |
|---|---|---|---|
| 2,691,154 | 10/1954 | Raichman | 341/102 |
| 3,218,627 | 11/1965 | Loughhead | 341/102 |
| 3,238,377 | 3/1966 | Seeber, Jr. | 341/102 |
| 3,458,735 | 7/1969 | Fiske | 341/171 |
| 3,597,761 | 8/1971 | Fruschilla et al. | 341/156 |
| 3,706,984 | 12/1972 | Naganuma et al. | 341/102 |
| 4,099,173 | 7/1978 | Zeskind et al. | 341/156 |
| 4,179,687 | 12/1979 | Van de Plassche et al. | 341/162 |
| 4,315,255 | 2/1982 | Harris et al. | 341/133 |
| 4,635,036 | 1/1987 | Yoshizawa | 341/156 |
| 4,672,359 | 6/1987 | Silver | 341/171 X |
| 4,866,373 | 9/1989 | Harada et al. | 341/133 X |
| 4,879,488 | 11/1989 | Silver | 341/171 |
| 4,903,026 | 2/1990 | Tiemann et al. | 341/161 |
| 4,922,250 | 5/1990 | Phillips et al. | 341/133 |
| 4,956,642 | 9/1990 | Harada | 341/133 |
| 4,999,631 | 3/1991 | Sugimoto | 341/156 |

*Primary Examiner*—Benjamin R. Fuller
*Assistant Examiner*—Randy W. Gibson
*Attorney, Agent, or Firm*—Kenyon & Kenyon

[57] ABSTRACT

A parallel analog to digital converter which uses a dual-rank arrangement of flash converters. The flash converters have Josephson junctions and act as a sample and hold circuit. The dual-rank arrangement allows a smaller number of comparators to be used than in a pure parallel conversion scheme, which also makes encoding the outputs of the flash converters less complex. The analog to digital converter includes an encoder which controls its output interferometers based on the net flux generated by combinations of input currents into the encoder.

11 Claims, 4 Drawing Sheets

PARALLEL ANALOG TO DIGITAL CONVERTER

FIELD OF THE INVENTION

The present invention relates to the field of analog to digital converters and more specifically, to a parallel analog to digital converter which uses Josephson junctions.

BACKGROUND OF THE INVENTION

A parallel (or flash) analog to digital (A/D) converter provides high speed conversion of an analog signal to a digital representation. Previous designs of parallel converters using Josephson junctions attempted to use interferometer periodicity to reduce the number of comparators required for an n-bit A/D converter from $2^{n-1}$ to n. Although such a reduction is desirable from a circuit complexity standpoint, the trade-offs necessary in the interferometer design restrict conversion accuracy and/or high speed performance. Best performance performance could only be achieved with the addition of a sample and hold circuit ahead of the converter.

A second problem with parallel converters is the number of comparators that are required. In a pure parallel converter, for example an 8-bit converter, 255 comparators are required. Such a large number of comparators also requires a complex encoder in order to encode the 255 lines into an eight line output suitable for use or further processing.

SUMMARY OF THE INVENTION

The invention solves the above problems by providing a flash converter which acts as a sample and hold circuit. The invention also reduces the complexity of a parallel converter by using a multiple rank arrangement. The invention also provides a novel encoder.

The flash converters of the present invention use comparators that have Josephson junctions which are current sensitive threshold detectors. The voltage difference between the well defined zero voltage of the comparator in the superconducting state and the sum gap voltage, which is a property of the superconducting materials employed, can be used to set accurate output currents. These output currents, derived from the outputs of the comparators of the flash converters, are easily summed to produce the quantized output necessary in multiple rank converters. Since the outputs of the Josephson junctions of the comparators remain stable, the flash converter/current summation stage acts as a quantizing sample and hold circuit.

By using a multiple rank scheme, only thirty comparators are needed, as opposed to 255 comparators in a pure parallel converter such as an eight-bit converter. Also, the 255 lines in such a converter need not be encoded into eight lines requiring complex logic since by using a dual rank design, two stages are required, each of which converts 15 lines (for a total of 30 lines) into four lines each (a total of eight lines).

One embodiment of the invention provides a converter which compares an input signal to a reference level to produce a quantized output. The converter has a plurality of comparators coupled in parallel, each comparator having as an input the input signal, with the input signal being divided equally among the comparators. Each comparator also has as an input a reference signal related to the reference level, with the reference signal for each particular comparator being different from the reference signals from the other comparators. Each comparator has a Josephson junction responsive to the input signal and the reference signal to cause the comparator to produce a comparator output which is combined with the other comparator outputs to form the quantized output.

Another embodiment of a converter according to the invention compares an input signal to a reference signal to produce a quantized output and is a flash analog to digital converter having as inputs the input signal and the reference signal, and which produces the quantized output. The converter includes a plurality of parallel comparators, each of which has a Josephson junction coupled to the input signal and a reference signal and an interferometer at the comparator output with an output level which is dependent on the response of the Josephson junction to the input signal and the reference signal. The comparator outputs of the interferometers form the quantized output.

A quantizing sample and hold circuit according to the present invention is provided by a flash analog to digital converter which compares an input signal to a reference signal to produce a quantized output. The converter has a plurality of parallel coupled comparators, each of the comparators including a Josephson junction which is responsive to the input signal and the reference signal and an interferometer which produces a comparator output that is dependent on the response by the Josephson junction. The comparator outputs of the interferometers are stable for a given input signal and are summed to form the quantized output which is therefore stable so that the quantizer operates to sample and hold the input signal.

The invention also provides a multiple rank analog to digital converter comprising a first Josephson junction flash converter which converts an analog input signal to a quantized output current and a first partial digital representation of the analog input signal. This is done by comparison of the analog input signal to a first reference signal. The multiple rank converter also has a second Josephson junction flash converter, coupled to the first Josephson junction flash converter, which compares and converts a summation of the analog input signal and the quantized output current to a second partial digital representation of the analog input signal; by a comparison of the summation to a second reference signal. The converter also has an encoder coupled to the first and second Josephson junction flash converters which encodes the first and second partial digital representations into a third digital representation of the analog input signal.

The invention also includes an encoder which encodes n current inputs into an n-bit digital output comprising n control lines, each of the control lines carrying current from different subsets of the n current inputs. A first one of the control lines contains n-1 counterloops in which current flows in a direction opposite to the direction of current flow in control sections of the control lines. Current flow in the counterloop cancels flux which is created by an equal current flow in an adjoining control section. The encoder has n interferometers, coupled to the n control lines, each interferometer producing one bit of the n-bit digital output in dependence on the net flux created by the currents flowing in the control sections and in the counterloops. Each interferometer has an associated control section, and less than all the interferometers also have an associated counterloop. A particular interferometer produces a first output when the net flux created in an associated control section and the associated counterloop is greater than zero and produces a second output when the net flux is zero.

DETAILED DESCRIPTION

Figure 1:
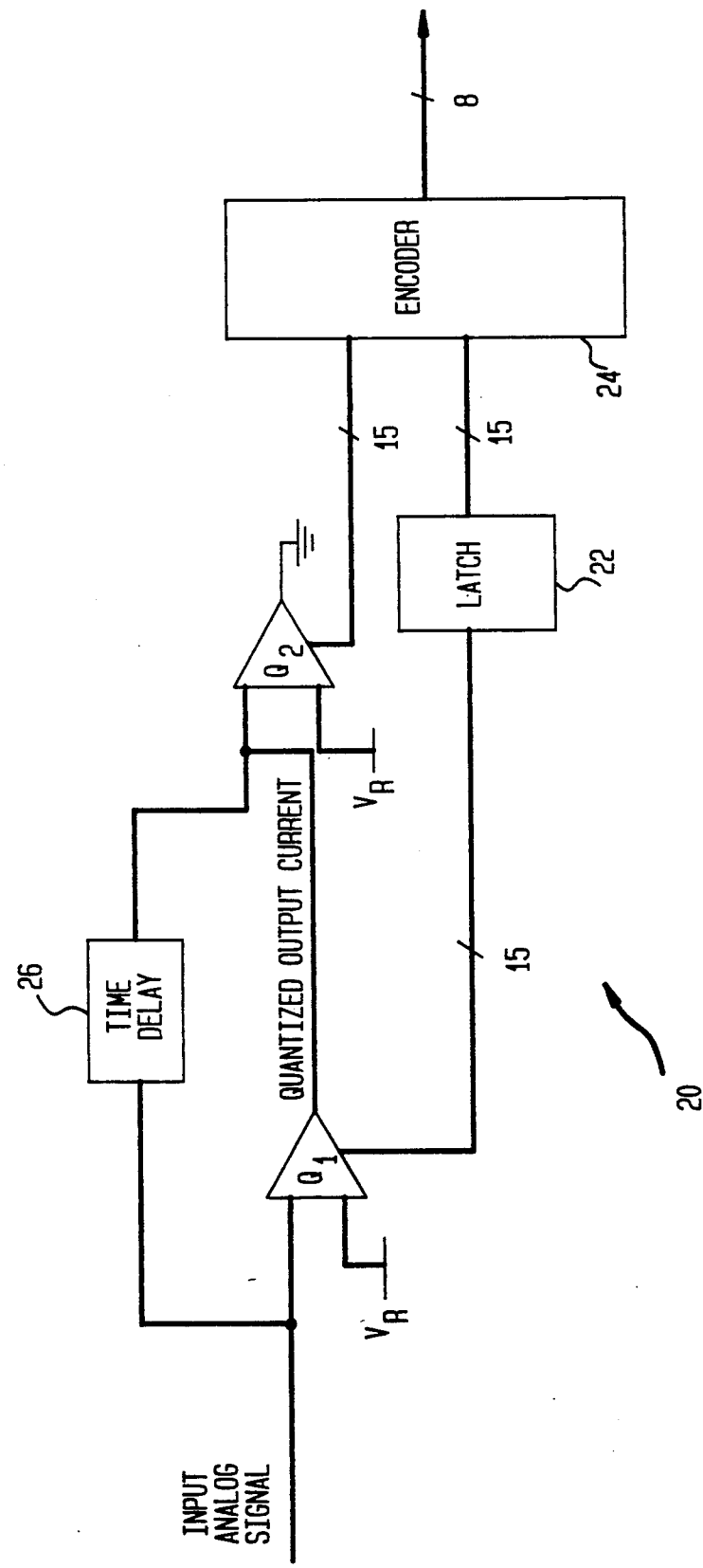
FIG. 1 is a pipelined parallel analog to digital converter according to an embodiment of the present invention.

A pipelined parallel analog to digital (A/D) converter 20 constructed according to the present invention is shown in FIG. 1. The main components of the converter 20 are quantizers $Q_1$, $Q_2$, latch 22, encoder 24 and time delay 26.

The quantizers $Q_1$, $Q_2$ are parallel four-bit quantizers which output both digital "thermometer" code and analog quantized output current. Thermometer code refers to binary code in which a level is represented by how many of the number of bits beginning with the least significant bit are high. For example, 00111 represents a higher level than 00011, with the next higher level being represented by 01111. The details of the quantizers $Q_1, Q_2$ will be discussed later with reference to FIG. 2. The term "quantized" in this context is taken to mean "compared".

An analog signal which is to be digitized is received during the first half $\phi_1$ of a clock phase in one input of quantizer $Q_1$. The quantizer $Q_1$ compares this analog signal with a reference volta $V_R$ present at its other input. Based on this comparison, the quantizer $Q_1$ produces both a quantized analog output current, and fifteen binary bits. These fifteen bits represent the most significant bits of the digital representation of the input analog signal.

At the same time that the quantizer $Q_1$ is quantizing and digitizing the input analog signal, the time delay 26 is delaying the same input analog signal being received by the second quantizer $Q_2$. This delay is equal to the amount of time it takes for the comparison by quantizer $Q_1$. Thus, the original input analog signal and the quantized output current will reach the second quantizer $Q_2$ simultaneously so that the same time point of the input analog signal is compared by the second quantizer $Q_2$ as was compared by quantizer $Q_1$. It should be noted that the quantized output current is the negative of the input analog signal. The quantized output current from quantizer $Q_1$ is added to the delayed input analog signal, the sum of these two signals being sent to one input of the second quantizer $Q_2$.

Although the quantized output current has been added to the delayed input analog signal, it should be remembered that the quantized output current has been negatived, so that the signal reaching the input of the second quantizer $Q_2$ is actually the difference between the input analog signal and the previously quantized signal. The signal received by the second quantizer $Q_2$ will therefore be termed the difference signal.

During the second half $\phi_2$ of the clock phase, the second quantizer $Q_2$ compares (quantizes) the difference signal with the reference voltage $V_R$ that is present at its other input. The outputs of the second quantizer $Q_2$ are fifteen binary bits which represent the least significant bits of the digital representation of the input analog signal, and a second quantized output current. This second quantized output current is not used and is therefore tied to ground.

During this second half $\phi_2$ of the clock phase, the latch 22 has received the fifteen binary bits from the first quantizer $Q_1$ and has stored these bits. The latch 22 releases its fifteen bits at the same time that the second quantizer $Q_2$ outputs its fifteen bits, so that the encoder 24 will receive all thirty bits corresponding to the same input analog signal at the same time.

The encoder 24 receives the thirty bits of "thermometer" code and encodes these thirty bits into an eight bit output that represents the analog signal as a digital number.

The A/D converter 20 of the present invention is a pipelined converter. In other words, during the second half $\phi_2$ of the clock phase, during which the second quantizer $Q_2$ is quantizing the difference signal, the first quantizer $Q_1$ will be quantizing the next input analog signal. Such a pipelined parallel conversion process is faster than waiting for both quantizers and the encoder to convert one input analog signal before starting to convert the next signal.

Figure 2:
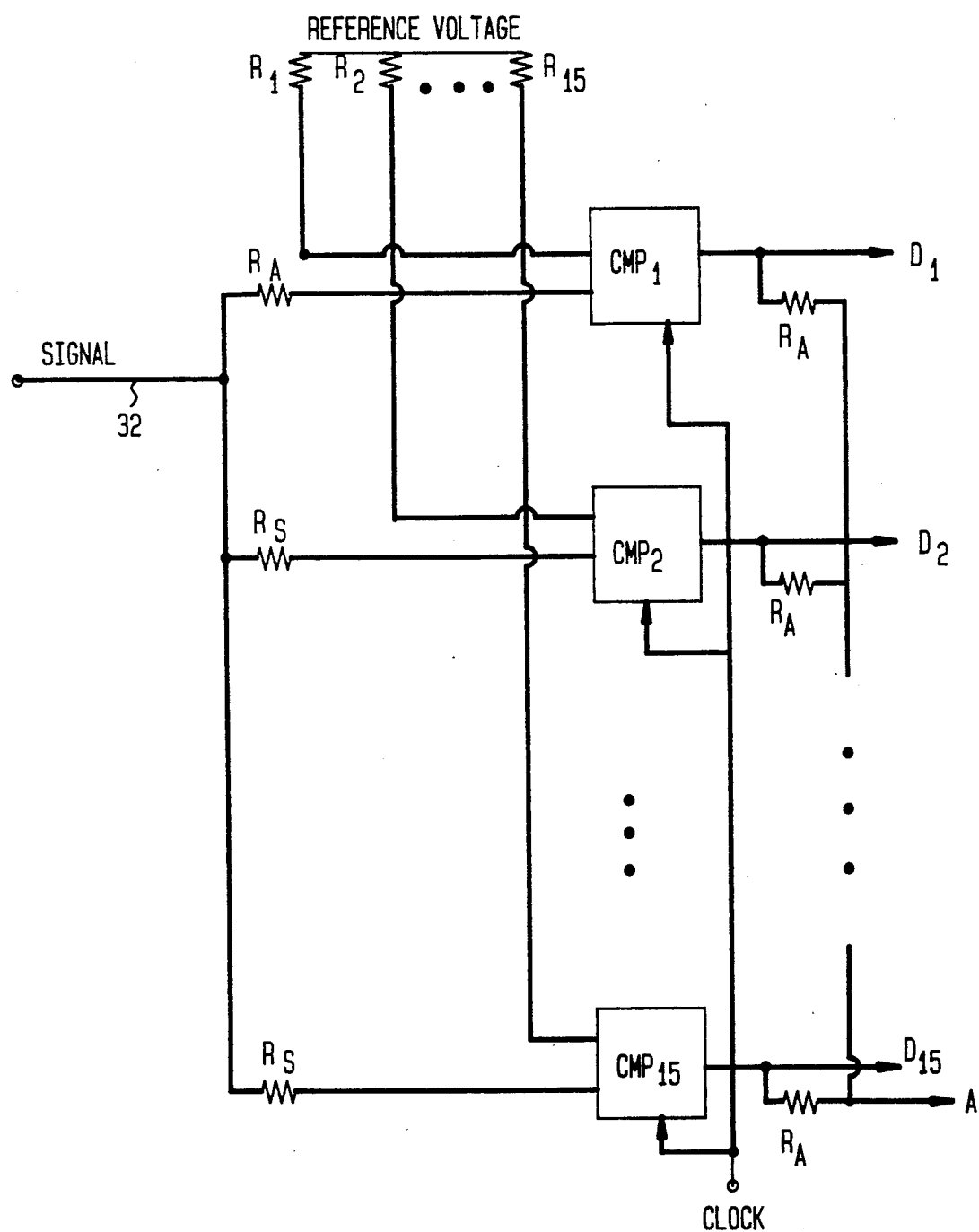
FIG. 2 is a schematic diagram of an embodiment according to the present invention of the quantizer used in the converter of FIG. 1.

An embodiment of the quantizers $Q_1$ and $Q_2$ is illustrated in FIG. 2. These quantizers $Q_1$ and $Q_2$ are flash (or parallel) analog to digital converters. A quantizer receives an input signal over input line 32. In the first quantizer $Q_1$ this input signal is the input analog signal, and in the second quantizer $Q_2$ this input signal is the difference signal. In the illustrated embodiment, the input line 32 is connected to each of fifteen comparator circuits $CMP_1$–$CMP_{15}$, through signal resistors $R_s$ such that the input signal is equally divided. A reference volta $V_{REF}$ is also connected to each of the comparator circuits $CMP_1$–$CMP_{15}$. Associated with the reference voltage $V_{REF}$ are reference resistors $R_1$–$R_{15}$, one reference resistor each being connected between the reference voltage $V_{REF}$ and the junction points between the signal resistors $R_s$ and each comparator circuit $CMP_1$–$CMP_{15}$. Each reference resistor has a resistance value which is greater than the resistance value of the preceding resistor.

Although fifteen comparators are shown in the example, any number of comparators can be used to comprise the quantizers $Q_1$ and $Q_2$.

The reference volta $V_{REF}$ and the reference resistors $R_1$–$R_{15}$ provide an increasing sequence of reference currents to the comparator circuits $CMP_1$–$CMP_{15}$ to be compared against the equally divided input signal. As the input signal level increases, such as periodically happens for a sine wave signal, more and more of the comparator circuits $CMP_1$–$CMP_{15}$ will switch from a low to a high signal. The digital outputs ($D_1$–$D_{15}$) of the comparator circuits $CMP_1$–$CMP_{15}$ are separately coupled to the encoder 24 and also are connected together through resistors $R_4$, so that each will provide a current component to a quantized analog output current A. The quantized analog output current A of quantizer $Q_1$ is an input to quantizer $Q_2$, while the quantized output current A of comparator $Q_2$ is unused and flows to ground.

The digital signals $D_1$–$D_{15}$ will not be a true binary code since if there is a high output for $D_4$, for example, there must also be high outputs for $D_1$-$D_3$. Thus there is not a combination of ones and zeros (where a high output is a one, and a low output is a zero). Instead, all the digital outputs preceding the maximum digital output for a given analog signal will be a one (as well as for the highest reached output) and will be a zero for those outputs succeeding it. The digital outputs $D_1$-$D_{15}$ of each quantizer $Q_1,Q_2$ are coupled to the encoder 24.

Figure 3:
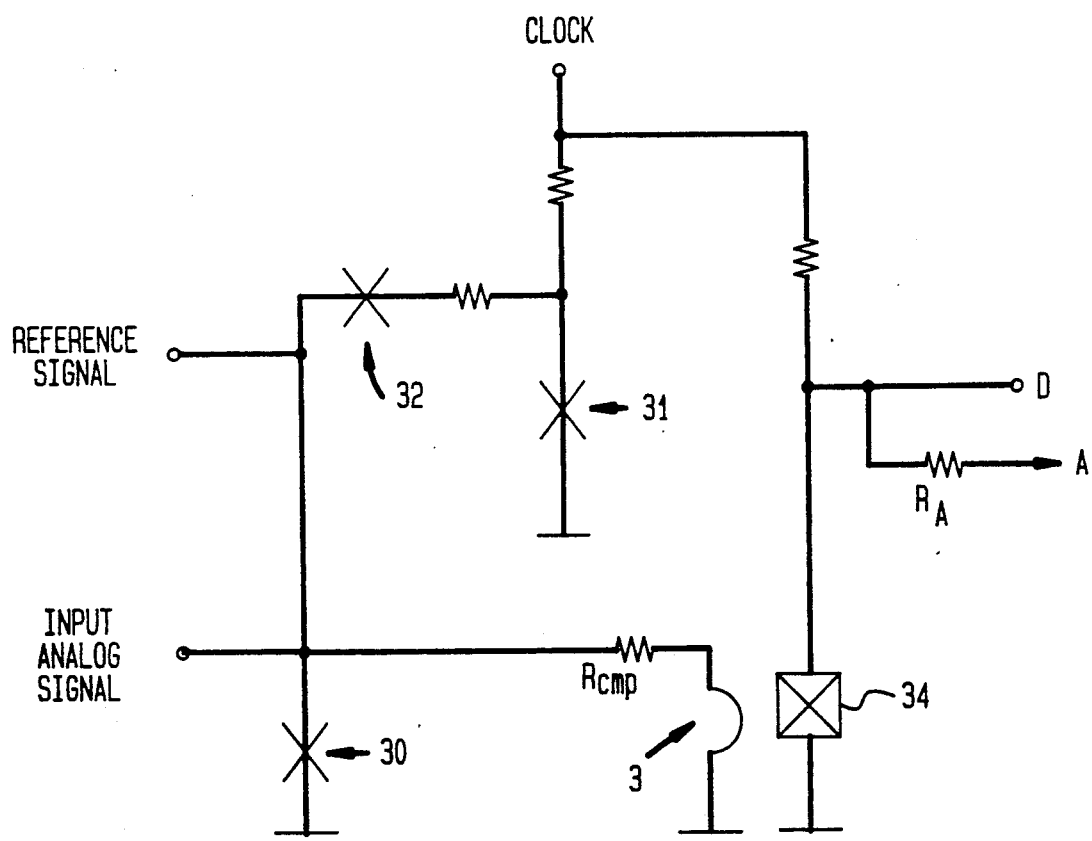
FIG. 3 is a schematic diagram of a comparator usable in the converter of FIG. 2.

An example of a comparator which can be used for the comparators $CMP_1$-$CMP_{15}$ is illustrated in FIG. 3. The comparator has three Josephson junctions 30, 31, 32, a control line 33 and an interferometer 34. In operation, a strobe pulse current is generated through Josephson junction 32 when the clock signal crosses a critical current of Josephson junction 31. The device will pulse current through resistor $R_{CMP}$ and into control line 33 when the sum of the input signal current, the reference signal current and the strobe pulse current exceeds the critical current of the Josephson junction 30. Current in the control line 33 causes the interferometer 34 to switch to the voltage state, signaling a logic "1" output. Lack of switching signals a logic "0" output.

Figure 4:
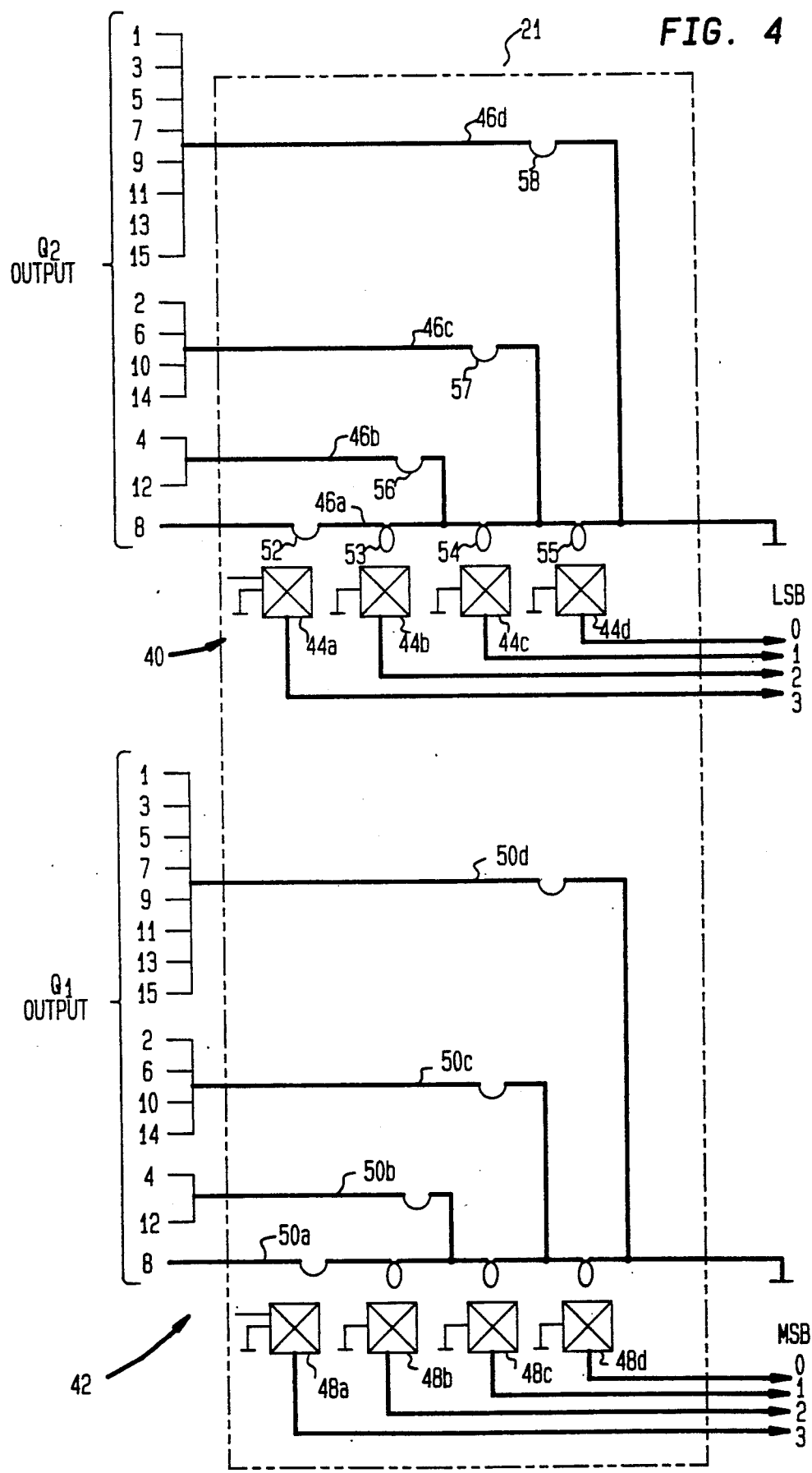
FIG. 4 is a schematic diagram of an embodiment according to the present invention of the encoder used in the converter of FIG. 1.

An embodiment of the encoder 24 used in FIG. 1 is illustrated in FIG. 4. The encoder 24 comprises a least significant half 40 and a most significant half 42. Each half 40,42 encodes fifteen binary bits into four binary bits. The least significant half 40 encodes those bits which are produced by the second quantizer $Q_2$, while the most significant half 42 encodes those bits which are produced by the first quantizer $Q_1$.

The least significant half 40 has four Josephson junction based interferometers 44a-d (one for each output bit LSB 0-3). There are also four control lines 46a-d which are connected to receive the various combination of bits from the second quantizer $Q_2$, as illustrated in FIG. 4. In other words, control line 46a receives quantizer output bit 8; control line 46b receives quantizer output bits 4 and 12; etc.

The control line 46a has a first control section 52 in which current flows in a first direction, and three counterloops 53-55 in which current flows in a direction opposite to the direction of the current flow in the control section 52. Each of the counterloops 53-55 are magnetically coupled with a different interferometer 44b-d. The other control lines 46b-d each have one control section 56-58 in which current flows in the same direction as in the first control section 52. Each of the control sections 52,56,57,58 are magnetically coupled with a different interferometer 44a-d. When there is current flow in one of the control sections, for example, the first control section 52, the associated interferometer 44a will switch to the voltage state so that a high (or 1) will be produced at the output of the interferometer 44a (LSB 3). However, when current flows in an associated control section and in an opposite direction in an associated counterloop, such as in counterloop 53 and control section 56, there is a cancellation of flux (net flux equal zero) so that the associated interferometer 44b will not enter the voltage state, and its output is a low (or 0). As can be seen in FIG. 4, some control lines 46b, 46c are coupled to the control line 46a so that current in the control lines 46b, 46c will also flow through counterloops 54, 55 or 55 respectively.

An example of the operation of the encoder 24 is as follows. Assume that the second quantizer $Q_2$ output is a 5. In that case, the least significant half 40 will receive current input on each of inputs 1-5. Input 4 will have current, while input 8 will not, so that there is current flow in control section 56 and not in counterloop 53. Thus, interferometer 44b will switch to the voltage state and produce a high on LSB 2. The current from control line 46b flows into control line 46a and through counterloops 54,55.

There is current through control line 46c and control section 57 from input 2. However, the flux from the current flow in control section 57 is cancelled by the flux produced by the current flow in the opposite direction in counterloop 54 from input 4. There is therefore no switching into the voltage state by interferometer 44c, and the output (LSB 1) of interferometer 44c remains a low. The current from control line 46c flows into control line 46a and counterloop 55.

The control line 46d and control section 58 receive current from three inputs (1,3 and 5). The counterloop 55 receives current from two inputs (2 and 4) through lines 46b and 46c. There is a cancellation of flux for two of the currents in control section 58, but the uncancelled flux due to the third current in control section 58 causes the interferometer 44d to switch to the voltage state and produce a high output on LSB 0. The least significant half 40 has produced a 0101 binary code (a 5 in decimal code) from current inputs 1-5.

The operation of the most significant half 42, having interferometers 48a-d and control lines 50a-d, is the same as above. The most significant half 42 receives the quantizer $Q_1$ digital output and produces the four most significant bits (MSB 4-7) of the binary code. It should be remembered that the delay latch 22 has delayed the current signals from quantizer $Q_1$ to the most significant half 42, so that the least significant half 40 and the most significant half 42 simultaneously receive and encode the outputs from quantizers $Q_1,Q_2$ corresponding to the same input analog signal. The output binary code can be sent to a memory for storage or a processor for further processing, for example.

The novel encoder 24 described above provides for thirty bit to eight bit encoding, although the invention is not limited to such encoding, since any number of stages could be used and different combinations of inputs to outputs can be made to produce a desired encoding.

What is claimed is:

1. A multiple rank analog to digital converter, comprising:
    a first Josephson junction flash converter which converts an analog input signal to an n-bit first partial digital representation of said analog input signal by comparison of said analog input signal to a reference signal and which combines n-bits of the first partial digital representation to provide a quantized analog output current;
    a second Josephson junction flash converter coupled to said first Josephson junction flash converter, which converts a summation of said analog input signal and said quantized analog output current of said first Josephson junction flash converter to a second partial digital representation of said analog input signal by a comparison of said summation to a second reference signal;
    an encoder; and
    means for coupling said encoder to each of the first and second Josephson junction flash converters, including means for simultaneously applying a first and second partial digital representations of said analog input signal to said encoder;
    said encoder operating to encode said simultaneously applied first and second partial digital representation into a complete digital representation of said analog input signal.

2. The multiple rank converter of claim 1, further comprising: a time delay coupled to said second Josephson junction flash converter which delays said analog input signal to said second Josephson junction flash converter such that a same time point of said analog input signal is compared by said second Josephson junction flash converter as was compared by said first Josephson flash converter; and a latch coupled between said first Josephson junction flash converter and said encoder, said latch operating to delay said first partial digital representation such that said encoder simultaneously receives said first and second partial digital representations of said analog input signal.

3. An encoder which encodes m current inputs into an n-bit digital output, comprising:
   n control lines, each of said control lines carrying current from different subsets of said m current inputs and having a control section, a first one of said control lines containing n-1 counterloops in which current flows in a direction opposite to direction of current flow in said control sections, wherein current flow in said counterloop cancels flux created by an equal current flow in an adjoining said control section;
   n interferometers, coupled to said n control lines, each said interferometer having a magnetically coupled said control section, and less than all said interferometers also having a magnetically coupled said counterloop, each said interferometer producing one bit of said n-bit digital output in dependence on net flux created by currents in said control section and said counterloop; and
   wherein a particular interferometer produces a first output when the net flux created in said magnetically coupled control section and said magnetically coupled counterloop is greater than zero and produces a second output when the net flux is zero.

4. The encoder of claim 3, wherein said n control lines are divided into at least two subsets which carry current from separate and different subsets of said m current inputs, and said n interferometers are divided into at least two subsets with outputs produced by a first subset of interferometers being least significant outputs and outputs produced by a second subset of interferometers being most significant outputs.

5. The encoder of claim 3, wherein m is 30 and n is 8.

6. The encoder of claim 1, which said n interferometers are superconducting interferometers.

7. A multiple rank analog to digital converter, comprising:
   a first Josephson junction flash converter which converts an analog input signal to a quantized output current and a first partial digital representation of said analog input signal by comparison of said analog input signal to a reference signal;
   a second Josephson junction flash converter, coupled to said first Josephson junction flash converter, which converts a summation of said analog input signal and said quantized output current to a second partial digital representation of said analog input signal by a comparison of said summation to a second reference signal;
   an encoder coupled to said first and second Josephson junction flash converters which encodes said first and second partial digital representations into a complete representation of said analog input signal; and
   wherein said encoder encodes m current inputs into an n-bit digital output, and includes n control lines, each of said control lines carrying current from different subsets of said m current inputs and having a control section, a first one of said control lines containing n-1 counterloops in which current flows in a direction opposite to direction of current flow in said control sections, wherein current flow in said counterloop cancels flux created by an equal current flow in an adjoining said control section, said encoder further includes n interferometers, coupled to said n control lines, each said interferometer having a magnetically coupled said control section, and less than all said interferometers also having a magnetically coupled said counterloop, each said interferometer producing one bit of said n-bit digital output in dependence on net flux created by currents in said control section and said counterloop, and wherein a particular interferometer produces a first output when the net flux created in said magnetically coupled control section and said magnetically coupled counterloop is greater than zero and produces a second output when the net flux is zero.

8. A method of converting an input analog signal to a digital representation of said signal, the method comprising the steps of:
   converting said input analog signal using a first Josephson junction flash converter into an n-bit first partial digital representation;
   combining n-bits of the first partial digital representation to provide a quantized analog output current;
   forming a summation of said quantized analog output current and said input analog signal;
   converting said summation in a second Josephson junction flash converter into a second partial digital representation;
   transmitting each of the first and second partial digital representations to an encoder;
   delaying the transmission of the second partial digital representation relative to the transmission of the first partial digital representation so that the first and second partial digital representations arrive simultaneously at the encoder; and
   operating the encoder to encode the first and second partial digital representations into a complete digital representation of said input analog signal.

9. A method of encoding m-bit binary code into n-bit binary code where n is less than m, the method comprising the steps of:
   sending a P current representing P logical 1 bits of said m-bit code onto one of n control lines, wherein one of said n control lines has n-1 counterloops, and each said n control line has a control section, each counterloop being associated with a control section, wherein an equal amount of current in a control section and an associated counterloop produces a zero net flux, and an unequal amount of current produces a greater than zero net flux;
   magnetically coupling each of said superconducting interferometers to one of said n control sections, and magnetically coupling all but one of said n superconducting interferometers to one of said n-1 counterloops;
   producing in each said superconducting interferometer a first output when said net flux in said magnetically coupled control section and said magnetically coupled counterloop is zero and a second output when said net flux is greater than zero; and forming said n-bit binary code from said outputs of said n superconducting interferometers.

10. A converter which compares an output signal to a reference level to produce a quantized output, comprising:

a plurality of comparators coupled in parallel, each of said comparators having as an input a divided portion of said input signal, with said input signal being divided equally among said comparators, each of said comparators also having as an input a reference signal related to said reference level, with the reference signal for each particular comparator being different from the reference signals for other comparators;

each of said comparators having a Josephson junction responsive to said divided input signal and said references signal to cause each of said comparators to produce a comparator output which is combined with other comparator outputs to form said quantized output; and wherein each of said comparators includes: a control line coupled to said Josephson junction such that current flows through said control line when a sum of said divided input signal and said reference signal exceeds a critical current of said Josephson junction; and an interferometer which switches to a voltage state when current flows through said control line, said interferometer having a comparator output line which has a first level of output when said interferometer is in the voltage state, and a second level of output when said interferometer is not in the voltage state.

11. A multiple rank analog to digital converter comprising:

a first Josephson junction flash converter which converts an analog input signal to a quantized output current and a first partial digital representation of said analog input signal by comparison of said analog input signal to a reference signal;

a second Josephson junction flash converter, coupled to said first Josephson junction flash converter, which converts as summation of said analog input signal and said quantized output current to a second partial digital representation of said analog input signal by a comparison of said summation to a second reference signal;

an encoder coupled to said first and second Josephson junction flash converters which encodes said first and second partial digital representations into a complete representation of said analog input signal;

means for delaying said input analog signal to said second Josephson junction flash converter such that said first Josephson junction flash converter converts said analog input signal during a first half of a clock phase and said second Josephson junction flash converter converts said summation during a second half of said clock phase; and means for latching said first partial digital representation during second half of said clock phase such that said first and second partial digital representations for said analog input signal arrive at said encoder simultaneously.

* * * * *